United States Patent
Nakata et al.

[11] Patent Number: 5,861,192
[45] Date of Patent: Jan. 19, 1999

[54] METHOD OF IMPROVING ADHESIVE PROPERTY OF POLYIMIDE FILM AND POLYMIDEFILM HAVING IMPROVED ADHESIVE PROPERTY

[75] Inventors: Masao Nakata; Kosuke Kataoka; Hirosaku Nagano, all of Otsu, Japan

[73] Assignee: Kanegafuchi Kagaku Kogyo Kabushiki Kaisha, Osaka, Japan

[21] Appl. No.: 690,975

[22] Filed: Aug. 1, 1996

[30] Foreign Application Priority Data

Aug. 3, 1995 [JP] Japan ................................ 7-219568

[51] Int. Cl.$^6$ ................ B05D 3/00; B05D 3/08; B05D 3/12
[52] U.S. Cl. .................... 427/322; 427/223; 427/354; 427/368; 427/371; 427/307; 427/379; 427/384
[58] Field of Search ...................... 427/307, 322, 427/316, 223, 354, 11, 146, 290, 340, 384, 379, 355, 429, 368, 371

[56] References Cited

U.S. PATENT DOCUMENTS

| | | | |
|---|---|---|---|
| 3,767,538 | 10/1973 | Politycki et al. | 427/307 |
| 3,791,848 | 2/1974 | DeAngelo | 427/307 |
| 4,078,096 | 3/1978 | Redmond et al. | 427/307 |
| 4,152,195 | 5/1979 | Bahrle et al. | 427/379 |
| 4,495,253 | 1/1985 | Abel | 427/304 |
| 4,568,632 | 2/1986 | Blum et al. | 427/555 |
| 4,711,822 | 12/1987 | Choyke et al. | 427/98 |
| 4,755,424 | 7/1988 | Takeoka et al. | 427/536 |
| 4,775,449 | 10/1988 | Dumas et al. | 427/306 |
| 4,822,451 | 4/1989 | Ouderkirk et al. | 427/322 |
| 4,824,699 | 4/1989 | Woo et al. | 427/307 |
| 4,842,946 | 6/1989 | Foust et al. | 427/307 |
| 4,847,139 | 7/1989 | Wolf et al. | 427/96 |
| 5,104,734 | 4/1992 | Anschel | 427/419.1 |
| 5,198,264 | 3/1993 | Altman et al. | 427/419.1 |
| 5,527,621 | 6/1996 | Matsuura et al. | 427/387 |

*Primary Examiner*—Diana Dudash
*Attorney, Agent, or Firm*—Armstrong, Westerman, Hattori, McLeland & Naughton

[57] ABSTRACT

The invention solves a problem of that sufficient adhesive intensity to satisfy recent demand for high adhesive property cannot be obtained by conventional surface treatment, and provides a method of improving adhesive property of polyimide film and achieving distinctly improved effect of adhesive property. The invention further provides novel polyimide film having improved adhesive property.

A method for improving adhesive property of polyimide film according to the present invention comprises a combination of steps of;

execution of a liquid applying process for treating polyimide film surface by exerting physical mechanical force on said film surface under the condition of that said film surface remains wet with water or organic solvent, or solution of organic solvent or aqueous solution; and execution of a surface treatment process for treating polyimide film surface by performing selected treatment among flame treatment, alkaline treatment, coupling agent treatment or surface treatment by way of projecting grinding material of fine grading onto film surface at high velocity, and said steps are performed in an arbitrary order. For example, using a surface treating device 10 shown in FIG. 1, consecutive execution of a surface treatment process for treating film surface, a liquid applying process and a drying process is realized by that polyimide film 22 is run from a feeding device 18 to a winding device 20.

10 Claims, 3 Drawing Sheets

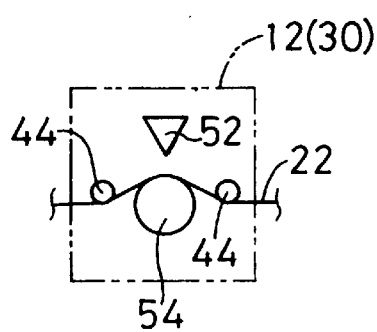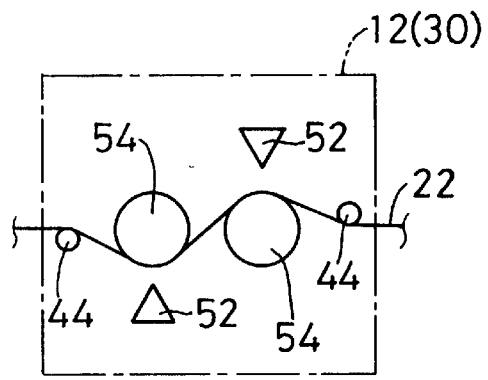
Fig.7(a)　　Fig.7(b)
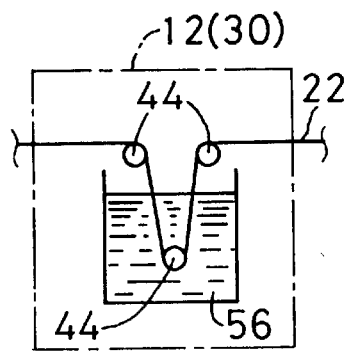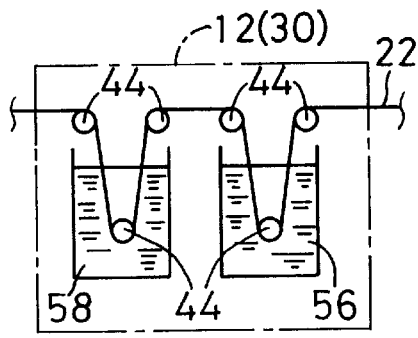
Fig.8　　Fig.9
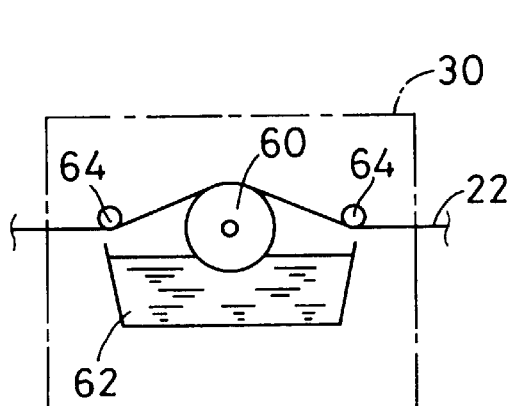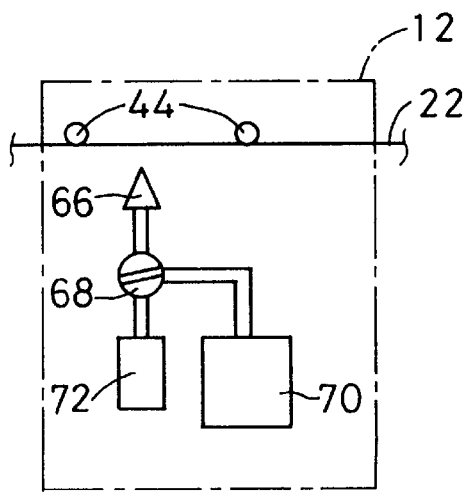
Fig.10　　Fig.11

METHOD OF IMPROVING ADHESIVE PROPERTY OF POLYIMIDE FILM AND POLYMIDEFILM HAVING IMPROVED ADHESIVE PROPERTY

BACKGROUND OF THE INVENTION

The present invention relates to a method of improving adhesive property of polyimide film, more particularly, to a method of improving adhesive property of polyimide film capable of stably generating distinct adhesive property without affecting adhesive agent, and the invention further relates to polyimide film having distinct adhesive property improved by the method of improving adhesive property.

Normally, polyimide film is used for a flexible printed circuit board (FPC) after being laminated with metallic foil (mainly with copper foil) by using an adhesive agent or processed to a laminated board comprising a film layer and a metallic layer via evaporation, plating or a sputtering process. At that time polyimide film is used for a base film, however, poor adhesive property of the conventional polyimide film surface has raised a problem, and using such polyimide film causes faulty products.

One cause of poor adhesive property of polyimide film surface accounts for plane and smooth surface thereon. In detail, the polyimide film surface is smooth and plane even in the case when stabilizer and additive are mixed after producing film by casting solution and performing condensation polymerization of said solution in the process of producing film. When the film surface is smooth and plane, actual adhesive area between the film surface and adhesive agent is relatively contracted, and as a result, sufficient adhesive strength can hardly be generated.

It is scientifically known that stabilizer and additives which were mixed at the time of producing film preferentially bleed from the film surface produced by solution cast method to form "weak boundary layer" (WBL) and migration of low-molecular polymer such as oligomer as composing substance of weak boundary layer could be accelerated. It is also probable that contaminant such as oily matter generated from a film productive plant or contaminant present in the atmosphere adheres to the produced film to result in the formation of stained layer. There is such a case in which because these layers are easy to exfoliate from the film surface, in the case when adhered with adhesive agent or the like, molecular scale of film cannot be adhered firmly, and these layers become a factor to obstruct adhesive property of the film.

It is general to use polyimide film with various kinds of surface treatment given for improving adhesive property of polyimide film surface. Familiar examples of such surface treatments are flame treatment, alkaline treatment, coupling agent treatment for adhering coupling agent solution onto the film surface or sand blasting process by blasting silica sands or the like against the film surface by applying compressed air or centrifugal force.

Though operation functions of these treatments are not clarified, flame treatment is considered to improve adhesiveness of the polyimide film surface by removing evaporated or gassed WBL or stained layer on film surface and purifying film surface. Also alkaline treatment is considered to improve adhesiveness of polyimide film surface by removing WBL or stained layer from film surface with alkaline solution. Coupling agent treatment is considered to improve adhesiveness of polyimide film surface by introducing reactive radical by adhering coupling agent solution onto film surface. Sand blasting treatment is considered to improve adhesiveness of polyimide film surface by increasing adhering area between film surface and adhering agent by forming the uneven surface, and at the same time removing WBL or stained layer from said surface.

However, there has been such a problem that sufficient adhesive intensity to satisfy demand for materializing higher adhesive effect in recent years cannot fully be achieved by these conventional surface treatments.

BRIEF SUMMARY

To fully solve the above problem, the inventors of the present invention followed up studies in order to provide a novel method of improving adhesive property of polyimide film capable of stably achieving distinctly improved adhesive property and also provide novel polyimide film with distinctly improved adhesive property and have eventually achieved the invention.

The subject of the process to improve adhesive property of polyimide film according to the present invention initially comprises a combination of steps of;

execution of a liquid applying process for treating polyimide film surface by exerting physical mechanical force on said film surface under the condition that said film surface remains wet with water or organic solvent, or solution of organic solvent or aqueous solution; and execution of a surface treatment process for treating polyimide film surface by performing a selected treatment among flame treatment, alkaline treatment, coupling agent treatment or surface treatment by way of projecting grinding material of fine grading onto the film surface at high velocity, and said steps are performed in an arbitrary order.

In the inventive method of improving adhesive property of polyimide film, a drying process is performed for drying said film surface after executing said liquid applying process.

Further, in the inventive method of improving adhesive property of polyimide film, in said liquid applying process, after treating the polyimide film surface by exerting physical mechanical force on said film surface under the condition that said film surface remains wet with water or organic solvent, or a solution of either of the two, said film surface is treated with organic solvent which is the same or different solvent from said organic solvent, thereafter a drying process for drying said film surface is performed.

In addition, in the inventive method of improving adhesive property of polyimide film, in said alkaline treatment process, after alkaline treatment is performed, alkaline solution on said film surface is washed off.

Further, in the inventive method of improving adhesive property of polyimide film, in said alkaline treatment process, after alkaline treatment is performed, alkaline solution on said film surface is washed off, thereafter a drying process for drying said film surface is performed.

In addition, in the inventive method of improving adhesive property of polyimide film, after said coupling agent treatment process is performed, a drying process for drying said film surface is performed.

In addition, in the inventive method of improving adhesive property of polyimide film, said process for treating said film surface by way of projecting grinding material at high velocity comprises sand blasting treatment.

Essential aspects of the inventive polyimide film with improved adhesive property can be materialized by executing surface treatment via any of the above-referred methods for improving adhesive property.

A method for improving adhesive property of polyimide film of the present invention comprises a combination of steps of;

execution of a liquid applying process for treating polyimide film surface by exerting physical mechanical force on said film surface under the condition of that said film surface remains wet with water or organic solvent, or solution of organic solvent or aqueous solution; and execution of a surface treatment process for treating polyimide film surface by performing a selected treatment among flame treatment, alkaline treatment, coupling agent treatment or surface treatment by way of projecting grinding material of fine grading onto the film surface at high velocity, and said steps are performed in an arbitrary order. Effect of adhesive property is remarkably improved by treating the film surface by a combination of these two steps. Accordingly, a novel polyimide film having adhesive property improved by execution of the inventive methods for improving adhesive property of polyimide film shows surpassing adhesive property and is ideally suited for composing base films of flexible printed circuit boards.

BRIEF DESCRIPTION OF THE DRAWINGS

FIG. 5 is explanatory of still another construction of a device for a liquid applying process in FIGS. 1 or 2.

FIG. 6 is explanatory of still another construction of a device for a liquid applying process in FIGS. 1 or 2.

FIG. 7 is explanatory of construction of a device for flame treatment for the surface treatment process in FIGS. 1 or 2, and FIG. 7(a) is a device for one surface treatment and FIG. 7(b) is for double surface treatment;

FIG. 8 is explanatory of construction of a device for alkaline treatment for the surface treatment process in FIGS. 1 or 2;

FIG. 9 is explanatory of another construction of a device for alkaline treatment for the surface treatment process in FIGS. 1 or 2;

FIG. 10 is explanatory of construction of a device for coupling agent treatment for the surface treatment process in FIGS. 1 or 2;

FIG. 11 is explanatory of construction of a device for sand blasting treatment for the surface treatment process in FIGS. 1 or 2.

DETAILED DESCRIPTION OF THE INVENTION

A method for improving adhesive property of polyimide film according to the present invention comprises a combination of steps of;

execution of a liquid applying process for treating polyimide film surface by exerting physical mechanical force on said film surface under the condition that said film surface remains wet with water or organic solvent, or solution of organic solvent or aqueous solution; and execution of a surface treatment process for treating polyimide film surface by performing a selected treatment among flame treatment, alkaline treatment, coupling agent treatment or treatment by way of projecting grinding material of fine grading onto the film surface at high velocity, and said steps are performed in an arbitrary order. In addition, examples of solution used for the liquid applying are solutions of acid, alkali and silane coupling agent in water or organic solvent. Remarkably improved effect of adhesive property can be obtained by the treatment combining two processes including liquid applying, compared with sole execution of surface treatment selected among flame treatment, alkaline treatment, coupling agent treatment or treatment by way of projecting grinding material of fine grading onto film surface at high velocity.

Though the operation function cannot be clarified, double treatment effect operates synergistically regardless of the treatment order, therefore unexpected effect of improved adhesive property is obtained and adhesive property of film is remarkably improved by such treatment that two processes are combined.

Referring now to the accompanying drawing, inventive methods for improving adhesive property of polyimide film are described below. Polyimide film subject to surface treatment according to the inventive methods may extensively include those sheet-like films each having less than 10 $\mu$m up to less than 1000 $\mu$m of thickness independent of molecular formula.

Figure 1:
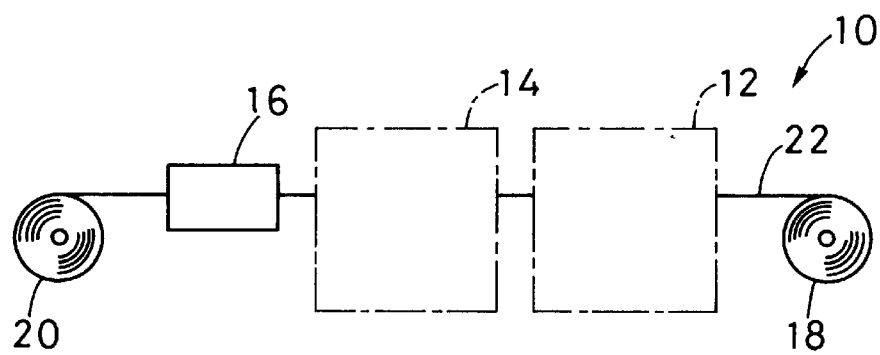
FIG. 1 is schematic explanatory of a surface treating device for implementing the inventive method for improving adhesive property of polyimide film.

For a device for executing the present invention, as shown in FIG. 1, a surface treatment device 10 can be adopted which comprises a device 12 for a surface treatment process for treating a film surface, a device 14 for a liquid applying process and a drying furnace 16 for drying a liquid applied film surface. The device 10 comprises in the process to run polyimide film 22 from the feeding device 18 to the winding device 20, continuous execution of processes: a surface treatment process for treating a film surface, a liquid applying process for treating said film surface by applying physical mechanical force on said film surface under the condition that said film surface remains wet with water or organic solvent, or solution of organic solvent or aqueous solution and a drying process for drying said surface. In addition, drying condition in the drying process is not specially limited, and can be set properly following experience including natural drying. The drying furnace 16 is shown for the drying process in the drawing, however the drying furnace 16 is not necessarily required. A device for drying film with cold or hot air in stead of the drying furnace 16 can be equipped and no limitation is given to the device.

Figure 2:
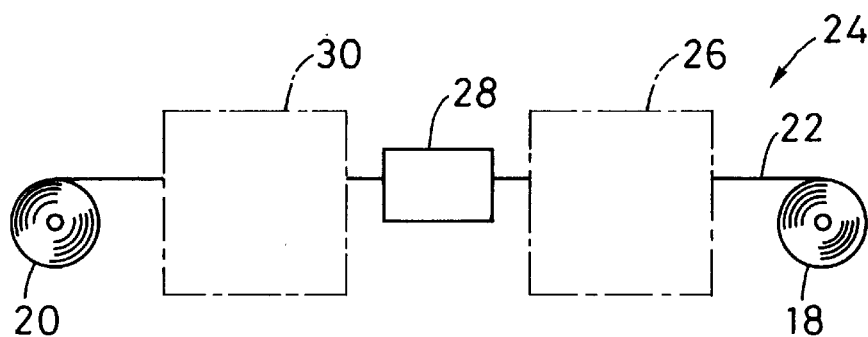
FIG. 2 is schematic explanatory of another surface treating device for implementing the inventive method for improving adhesive property of polyimide film.

The order of processes can be performed arbitrarily in the present invention. In order to perform processes in the order of a liquid applying process for treating film surface by exerting physical mechanical force on said film surface under the condition of that said film surface remains wet with water or organic solvent, or solution organic solvent or aqueous solution (We describe "liquid" after this), and a drying process of said surface, thereafter a surface treatment process for treating said surface, as shown in FIG. 2, a surface treatment device 24 can also be adopted which comprises a device 26 for the liquid applying process, a drying furnace 28 and a device 30 for the surface treatment process.

The surface treatment process for treating polyimide film surface according to the present invention can be exemplified by selected treatments among flame treatment, alkaline treatment, coupling agent treatment or surface treatment by way of projecting grinding material of fine grading onto the film surface at high velocity. The above described device 12 (or 30) in the surface treatment device 10 (or 24) is equipped with any of a flame treatment device, an alkaline treatment device, a coupling agent treatment device or a sand blasting treatment device. A conventional device can be used for the device 12 (or 30).

In addition, the liquid applying according to the present invention contains a treatment of applying physical mechanical force. Means to apply physical mechanical force in the liquid applying process are exemplified by brushing with rotary brushes. Although it is also possible to rub the film surface with cloth, paper, non-woven cloth, buff or sponge instead of brushing it with rotary brushes, taking productivity into consideration, it is recommended to use the rotary brushes. Applying physical mechanical force as described above means to rub the film surface with rotary brushes, paper, cloth, or the like, and aims at removing weak boundary layer and a stained layer formed on the film surface by performing a treatment of applying physical mechanical force under the condition of the film surface being wet with liquid.

Figure 3:
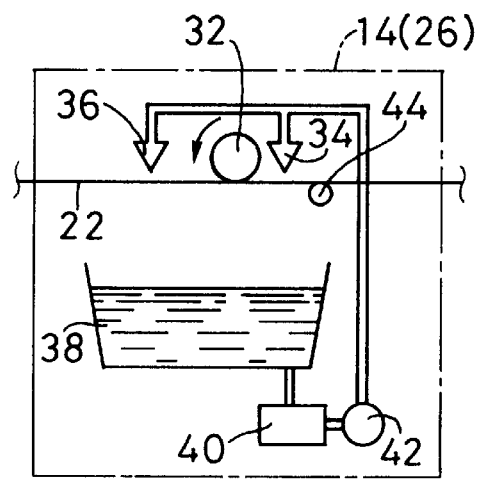
FIG. 3 is explanatory of construction of a device for a liquid applying process in FIG. 1 or 2.
Figure 4:
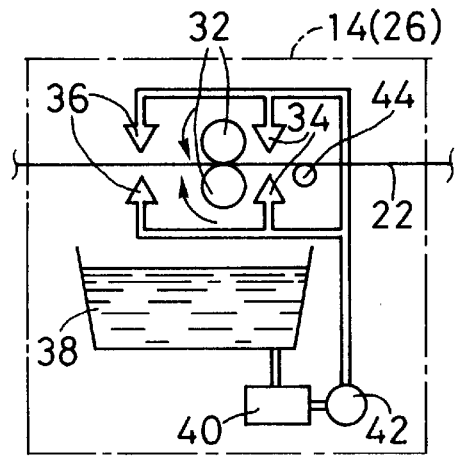
FIG. 4 is explanatory of another construction of a device for a liquid applying process in FIG. 1 or 2.

The following description is a concrete explanation of the device 14 (or 26) for the liquid applying process. As one example, as shown in FIG. 3, the device 14 (or 26) for the liquid applying process comprises a pair of rotary brushes 32, a nozzle 34 for blowing liquid against film surface, a rinse nozzle 36 and a liquid tank 38. Further, the nozzles 34 and 36 are provided via a circulation pump 40 and a filter 42 linked with the liquid tank 38. Blown off liquid can be recycled into the liquid tank 38 for repeated use. Although weak boundary layer or stained layer can be removed from the film surface by brushing with a pair of rotary brushes and applying physical mechanical force with said film surface wet with liquid in the liquid applying process, it is feared that extremely fine particles constituting the removed weak boundary layer or stained layer may still remain on the film surface after executing only the brushing. It is also probable that dust generated from the rotary brushes 60 may adhere to the film surface. In order to prevent the above problem, it is preferable to provide a rinse nozzle 36 and to wash the film surface after brushing. While operating the device 14(or 26), one surface of polyimide film can properly be treated with liquid. However, as shown in FIG. 4, a pair of rotary brushes 32 and nozzles 34 and 36 can be provided on both surfaces of polyimide film 22 to enable liquid applying of both surfaces. In addition, a mark 44 is a free roll for film 22 to preferably run.

The rotary brushes 32 may be rotated in the film running direction. However, it is rather preferred to rotate the brushes 60 in the direction inverse from the film running direction so that better effect of surface treatment can be achieved. Though there is no restriction on the brush material, it is essential that material of the rotary brushes 32 be selected from those which are free from practically damaging the film surface and drug proof. In addition, it is preferable to use such material that can effectively remove traces of sub-product produced by flame treatment, alkaline solution on film surface or adhesive deposit on film produced by sand blasting treatment or the like. Especially non-woven cloth is preferably used. Furthermore, it is desired that nylon, polypropylene, polyester or rayon be used for the rotary brush, in particular, rayon or polyester is most preferred. Although diameter of applicable filaments of the brush can optionally be selected based on experimental judgement without restriction, it is desired that filament diameter be in a range from 0.005 mm to 0.5 mm, in particular, it is preferred that the diameter be in a range from 0.01 mm to a maximum of 0.05 mm. In addition, there is no restriction on the rotational speed of the rotary brushes, running (processing) velocity of polyimide film, nipping pressure, material and hardness of the free roll 24, but these requirements may optimally be determined based on experiential judgement.

Available liquid includes water, boiled water or organic solvent. In particular, organic solvent is preferably used. In addition, solution of acid, alkali or silane coupling agent of water or organic solvent may also be used. More particularly, as organic solvent, alkane, alkene, alcohol, ketone, ether, halogen, carboxylic acid, aldehyde, amide, or the like, may be used on the individual basis or by way of mixture of two kinds or more than two kinds selected from the same or different kinds. In particular, alcoholic component such as ethanol, methanol or isopropanol, is preferred for use. Above all, ethanol is ideally suited for use. In addition, no limitation is applied to solution of acid, alkaline matter or silane coupling agent, however the same solution as the one used for alkaline treatment or coupling agent treatment described below can be used.

Figures 5A, 5B:
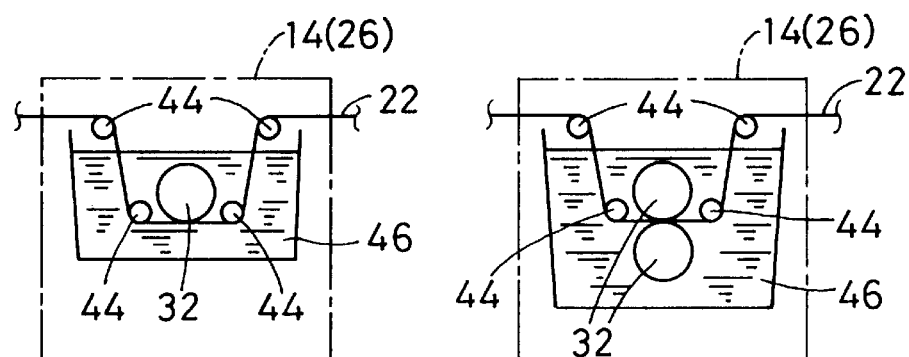
FIG. 5(a) is a device for one surface treatment and FIG. 5(b) is for double surface treatment.

The device 14 (or 26) for the liquid applying process can comprise that as an example, one surface or double surfaces of film 22 immersed in a liquid tank 46 are brushed with the rotary brushes 32 as shown in FIGS. 5 (*a*) and (*b*), without comprising that liquid is blown onto film surface as the above described. In the case of treating the film surface by immersing the film 26 in liquid, the film surface is washed by causing the brushed film 26 to run through liquid, and thus, weak boundary layer or stained layer can fully be removed from the film surface without necessarily providing a rinse nozzle. Said surface can also be treated with said organic solvent by providing a rinse nozzle.

Figures 6A, 6B:
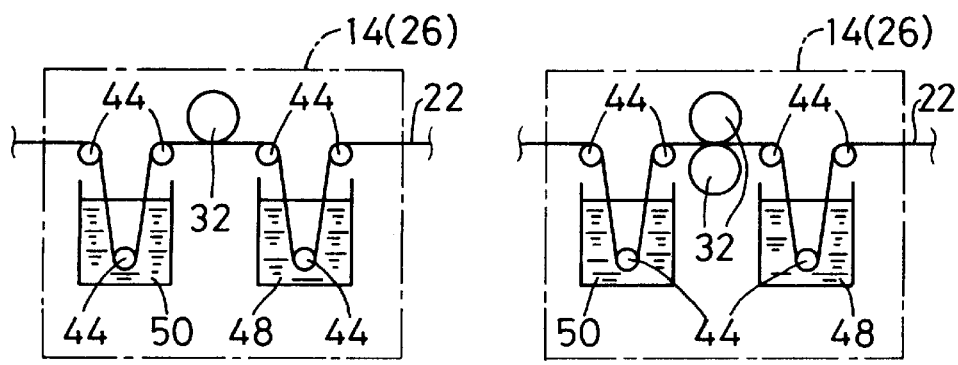
FIG. 6(a) is a device for one surface treatment and FIG. 6(b) is for double surface treatment.

In addition, as shown in FIGS. 6 (*a*) and (*b*), the device 14 (or 26) can comprise that after the film 22 being wet in a liquid tank 48, one surface or double surfaces of the film 22 are brushed with the rotary brushes 32, and further the film 22 is introduced into a liquid tank 50 to be purified. The device 14 (or 26) can comprise that a rinse nozzle is provided for blowing liquid after brushing instead of providing a liquid tank 50.

As the above described, a conventional device can be used for the device 12 (or 30) shown in FIG. 1 (or FIG. 2) for a surface treatment process. The following is an explanation of each example according to the present invention by combining each device and a detailed explanation of each device based on the drawings.

As one example of the present invention, the case for performing a liquid applying process and a flame treatment process in combination is explained. In the example, it is permitted either to perform treatment in the order of a flame treatment process, a liquid applying process and a drying process by using the surface treatment device 10 shown in FIG. 1, or to perform a flame treatment process after performing a liquid treatment process and a drying process by using the surface treatment device 24 shown in FIG. 2. In addition, the flame treatment process and the liquid applying process can be performed separately, however successive treatment of these two processes is preferable for performing film treatment efficiently.

Thus, adhesive intensity of polyimide film surface has been extremely improved by performing successive liquid applying after performing flame treatment or by performing successive flame treatment after performing liquid applying with no relation to the order of treatment, when compared with the case when flame treatment is solely performed.

Though operation function of the above treatment method is not clarified, in the case when flame treatment is performed solely, WBL or stained layer can be evaporated or changed into a gas by flame treatment, however it is considered that WBL or stained layer which cannot be removed by flame treatment whose condition is difficult to be set remains on the film surface, and that the residue prevents adhesive property of the film. Accordingly, it can be considered that the reason why adhesive property is remarkably improved by performing liquid applying on said surface after performing flame treatment is that film surface is purified at high level by removing remained WBL or stained layer on film surface after flame treatment by performing liquid treatment.

There has been a problem that a condition of flame treatment is difficult to be set, and that when the condition of flame treatment is extremely weak, sufficient effect of treatment cannot be obtained, on the contrary when treatment condition is extremely strong, there is possibility of the film being deteriorated and original characteristics thereof to be lost, and it is difficult to control treatment condition accurately. Therefore, it can be considered that when flame treatment is performed on said film surface after liquid applying treatment is performed in the reverse order to the above described treatment order, WBL or stained layer on the surface can be removed very safely and effectively even under the treatment conditions of comparatively weak and broad flame treatment by that the film surface is purified beforehand by performing liquid applying treatment thereafter flame treatment is performed on said surface, therefore remarkably improved effect of adhesive property can be obtained.

When a flame processor is explained concretely, as shown in FIG. 7 (a), the device comprises flame nozzle 52 for blowing flame over the surface of polyimide film 22 and a cooling roll 54 for cooling off the heated polyimide film. The film 22 is arranged to come in contact with the cooling roll 54 by the free roll 44 and the flame processor is arranged to execute a flaming process by way of minimizing thermal influence over the film substrate. Length of flame blown out of the flame nozzle 52 is arranged to be in a range from 10 mm to a maximum of 50 mm. The flame nozzle 52 is disposed at a position 5 mm through 40 mm apart from the polyimide film 22 in order that flaming process can be effected against the film 22 at a position corresponding to one third of the flame length from the tip of flame.

Concerning practical conditions of flaming process, there is no restriction and it is enough to select such conditions as not to deteriorate the film. Such conditions of the flaming process can be set based on experiential judgement. It is desired that flame containing 1000° C. through 2000° C. of heat be used, and that the film is treated by being rolled onto the cooling roll in order to reduce the influence of heat to the film substrate and to enable to perform flame process. The temperature of the cooling roll is preferred to be 10° C. to a maximum of 100° C., further more preferred to be 20° C. to a maximum of 50° C. The length of flame blown out of the flame nozzle is preferred to be 5 mm to a maximum of 100 mm, further more preferred to be 10 mm to a maximum of 50 mm. In addition, distance between film and flame nozzle is preferred that flame is treated at the position corresponding to one second or especially one third of the flame length from the flame tip.

In addition, a flame processor for treating one surface of the film is shown in FIG. 7 (a), however a flame processor may perform flame treatment on double surfaces of film as shown in FIG. 7 (b).

As another example of the present invention, the case which a liquid applying process and an alkaline treatment process are executed in combination is explained. In the example, treatment may be performed either in the order of an alkaline treatment process, a liquid applying process and a drying process by using the surface treatment device 10 shown in FIG. 1, or in the order of performing an alkaline treatment process after performing a liquid applying treatment process and a drying process on the condition that after alkaline treatment is performed in an alkaline treatment process, alkaline solution remained on the film surface is washed off, and thereafter said film is dried in the device 24 shown in FIG. 2.

By performing liquid applying consecutively after performing alkaline treatment or by performing alkaline treatment consecutively after performing liquid applying, adhesive intensity on polyimide film surface has been remarkably improved regardless of the treatment order, compared with the case alkaline treatment is solely performed. Though said alkaline treatment process and said liquid applying process can be performed separately, it is preferable to perform these processes consecutively in order to perform film treatment efficiently.

Though operation function by said treatment method is not clarified, polyimide film is generally poor in resistivity against alkaline solution, and thus, if the film surface were held in contact with alkaline solution for a long time, even the film substrate may occur degradation. To prevent the reaction from occurrence, it is essential that residual alkaline solution be washed off from the film surface immediately after taking out film from alkaline solution when alkaline treatment is solely performed. Though it is exemplified to immerse film in water after alkaline treatment or to neutralize alkaline solution on the film surface by using acid solution as methods to remove alkaline solution from the film surface, it has been difficult to produce safely film having sufficient adhesive intensity without spoiling inherent characteristics of polyimide film, because it is very hard to set treatment conditions properly. Accordingly, it is considered that alkaline solution can be quickly removed from the film surface and said film surface is purified to a high degree by that liquid applying is performed on said surface after alkaline treatment is performed, and as a result, safe and excellent effect of improved adhesive property can be obtained.

In addition, contrary to said treatment order, in the case alkaline treatment is performed on said surface after liquid applying is performed, it is considered that WBL or stained layer can be removed very effectively by performing alkaline treatment on the film surface after purifying said surface beforehand by performing liquid applying, and as a result, excellent effect of improved adhesive property can be obtained. In addition, in the case alkaline treatment is performed after liquid applying is performed, it is required to perform a washing process for washing off alkaline solution quickly on the film surface after alkaline treatment.

Alkaline treatment can be performed by conventional methods such as showering or immersing in liquid. The device for alkaline treatment comprises that film 22 is introduced in an alkaline treatment tank 56 by a free roll 44, as shown in FIG. 8, for example. Further, conventional methods such as washing with water or neutralizing treatment with acid can be used for washing off alkaline solution remained on the film surface. In the case a washing process is required, as shown in FIG. 9, the device comprises that film 22 is introduced in an alkaline treatment tank 56 and a washing tank 58 in order. Though a drawing is abbreviated, the surface treatment device 24 shown in FIG. 2 can be equipped with a drying furnace for drying film behind an alkaline treatment device 30.

No restriction is applied to alkaline solution provided that it has 7 or more than 7 of pH value. Solution of hydroxide of alkaline metal, alkaline earth metal or ammonium ion, or solution of hydrazine, carbonate or the like is used for alkaline solution, and aqueous solution of hydroxide of alkaline metal is preferably used, and further preferably aqueous solution of sodium hydroxide is used. In addition, these alkaline solutions can be used for the above described liquid applying process. Kind, concentration or treating time of alkaline solution are not particularly restricted, and can be set properly based on experiential judgement. For example, weak boundary layer and stained layer can be effectively removed from the film surface by immersing polyimide film in 5% by weight aqueous solution of sodium hydroxyl for 1~100 seconds, preferably for 10~30 seconds.

As another example of the present invention, an example of the inventive method by way of executing a liquid applying process and a coupling agent treatment process in combination is introduced below. In the example a coupling agent treatment process is performed after a liquid applying process and a drying process are performed by using the surface treatment device 24 shown in FIG. 2. In addition, though not shown in FIG. 2, a drying the furnace can be equipped for drying film after coupling agent treatment is performed.

Thus, adhesive intensity on polyimide film surface is remarkably improved by performing coupling agent treatment consecutively after liquid applying is performed, compared with the case a coupling agent treatment is solely performed. In addition, operation function of improved effect of adhesive property of film by performing coupling agent treatment is considered that surface component of the film and coupling agent are reacted by adhering uniformly coupling agent solution on the film surface to form a coat of coupling agent solution on the film surface to purify the film surface uniformly. Therefore, it is considered in the present example that because coupling agent is washed off by liquid applying when treatment order is carried out in reverse, it is difficult that effect of treatment is proved, and effect of improved adhesive property is faded. In addition, though said coupling agent treatment process and liquid applying process can be performed separately, consecutive performance of these processes are preferable in order to perform film treatment efficiently.

Though operation function of said treatment method is not clarified, it is considered that surface characteristics of polyimide film differ extremely depending on the conditions in producing film. Because of the above reason, it can be considered that when coupling agent treatment is performed solely, even when completely same coupling agent treatment is performed on the same film which was produced simultaneously, sufficiant treatment effect cannot be proved in some cases. Accordingly, it can be considered that reactive radical can be introduced uniformly and safely onto the film surface by applying coupling agent treatment after the film surface is purified beforehand by performing liquid applying. As a result, it is considered that adhesive intensity of the film is remarkably improved.

A coupling agent treatment device, as shown in FIG. 10, comprises a bar coater 60 for coating solution of coupling agent, a coupling agent bath 62 for storing solution of coupling agent, and a pressing roll 64. A part of the bar coater 60 is immersed in solution of coupling agent stored in the coupling-agent solution bath 62. The polyimide film 22 is adjustably brought into contact with the bar coater 60 by the pressing roll 64, and the film surface can be coated with solution of coupling agent by rotating the bar coater 60.

The bar coater 60 may be rotated in the film running direction or in the direction inverse therefrom. Such a roll made of non-woven cloth or the like, a rubber roll, or a meshed roll, may be used for the bar coater 60 without restriction on available material, but it is desired that the bar coater 60 be free from incurring damage onto the film surface.

FIG. 10 shows a device for coating coupling agent solution with a bar coater 60 as a means to adhere coupling agent solution, and it is also permissible to apply such a method comprising the following: roll coating method and any of a variety of coating methods, for example, spreader method by applying a doctor blade, Mayer bar coating method, gravure coating method, reverse roll coating method, brush coating method, air blast method, spray coating method, curtain coater method, dip coating method, etc.

There are a variety of coupling agents for implementing the inventive examples, for example, including silane, titanate, aluminium, or zirco-aluminium, or the like. Any of these coupling agents may be used on the individual basis or by way of mixing plural kinds according to experiential judgement. In particular, use of silane coupling agent is preferred. Above all, use of amino silane coupling agent is most preferred. Molecules of these coupling agents jointly contain reactive radicals such as methoxylic radical or ethoxylic radical having bonding property with superficial constituents of polyimide film and the other reactive radicals such as acrylic radical or amino radical or epoxy radical having bonding property with constituents of adhesive agent. Any of those coupling agents intermediately couples bonding between polyimide film and adhesive agent to help promote affinity between both.

Concretely, silane coupling agent includes the following: acrylic silanes include γ-methacryloxypropyltrimethoxysilane, γ-methacryloxypropyltriethoxysilane, γ-metacryloxypropylmethyldimethoxysilane, γ-methacryloxypropylmethyldiethoxysilane, γ-acryloxypropyltrimethoxysilane, and γ-acryloxypropylmethyldimethoxysilane.

Amino silanes include γ-aminopropyltrimethoxysilane, γ-aminopropyltriethoxysilane, γ-aminopropylmethyldimethoxysilane, γ-aminopropylmethyldiethoxysilane, N-phenyl-γ-aminopropyltrimethoxysilane, N-(phenylmethyl)-γ-aminopropyltrimethoxysilane, N-methyl-γ-aminopropyltrimethoxysilane, N,N,N-trimethyl-γ-aminopropyltrimethoxysilane, N,N,N-tributyl-γ-aminopropyltrimethoxysilane, N-β(aminoethyl)γ-aminopropyltrimethoxysilane, N-β(aminoethyl)γ-aminopropylmethyldinethoxy-silane, N-β(aminoethyl)γ-aminopropyltriethoxysilane, N-ω(aminohexyl)γ-aminopropyltrimethoxysilane, N-{N'-β(aminoethyl)}-β(aminoethyl)γ-aminopropyltrimethoxysilane, etc.

Epoxy silanes include β-(3,4-epoxycyclohexyl) ethyltrimethoxysilane, γ-glycidxypropyltrimethoxysilane, γ-glycidxypropyltriethoxysilane, γ-glycidxypropylmethyldiethoxysilane, γ-glycidxypropylmethyldimethoxysilane, etc.

Titanate coupling agent includes the following; isopropyltriisostearoyl titanate, isopropyltridodecylbenzenesulfonyl titanate, isopropyltris (dioctylpyrophosphate) titanate, tetraoctylbis(ditridecylphosphite) titanate, tetraisopropylbis (dioctylphosphite) titanate, tetra(2,2-diaryloxymethyl-1-butyl)bis(di-tridecyl)phosphite titanate, bis (dioctylpyrophosphate) oxyacetate titanate bis (dioctylpyrophosphate) ethylene titanate, isopropyltrioctanol titanate, isopropyldimethacrylisostearoyl titanate, isopropylisostearoyldiacryl titanate, isopropyltri(dioctylphosphate) titanate, isopropyltricumylphenyl titanate, isopropyltri(N-aminoethyl-aminoethyl) titanate, dicumylphenyloxyacetate titanate, diisostearoylethylene titanate, etc.

In addition, aluminium coupling agent includes alkylacetoacetate-aluminium-diisopropylate. Zircoaluminium coupling agent includes methacrylate zircoaluminate, for example.

Any of the above-exemplified coupling agents are used in the form of solution by dissolving them in solvent including the following: alcoholic solvent such as methanol, ethanol, propanol, isopropanol or sol-mix prepared by mixing these; ketone such as acetone, methyl ethyl ketone (MEK), 2-pentanon, or 3-pentanon; and aromatic hydrocarbon such as toluene or xylene, for example. These solvent components may be used on the individual basis or by way of mixing plural kinds of them, or in aqueous mixture. In particular, use of methanol is preferred. In addition, these coupling agent solutions can be used for the above described liquid applying process.

Preferably, concentration of solution of coupling agent is in a range from 0.005% to 30% by weight, more preferably, it should be in a range from 0.01% to 5% by weight. Since excessive concentration of coupling agent causes irregularity to be generated on the surface of polyimide film, it is by no means desirable in terms of appearance. Conversely, too weak concentration of coupling agent results in poor coupling effect.

As still another example according to the present invention, concerning the example in which a liquid applying process and a process for performing surface treatment by blasting off grinding sand material at high velocity are carried out in combination, a sand blasting process is exemplified which is for treating film surface by blowing silica sand or other sand against film surface by applying compressed air or centrifugal force. In the example, a liquid applying process and a drying process are performed after sand blasting process is performed by the surface treatment device 10 shown in FIG. 1. Though remarkable effect of improved adhesive property can be obtained by the present example regardless of the treatment order, it is preferable to perform liquid applying after said sand blasting process in order to have effective treatment. In addition, though said sand blasting process and liquid applying process can be performed separately, it is preferable to perform these treatments consecutively in order to perform effective film treatment.

Though operation function of the above treatment method is not clarified, it is considered that sand blasting process is a method to increase adhering area between film and adhesive agent by forming uneven surface on film, and to improve adhesive property by removing WBL or stained layer on film surface, however, it is considered in reality that WBL or stained layer is not removed sufficiently. In addition, it can be considered that it is required to restrict treatment conditions not to reduce film intensity. Therefore, it can be considered that performing sand blasting process solely has limitation in improving adhesive intensity of film without reducing intensity of polyimide film. Accordingly, it can be considered that uneven surface is formed on film surface to increase adhering area between film and adhesive agent by performing sand blasting treatment, thereafter by performing liquid applying WBL and stained layer can be removed and film surface is purified at high level, further dust produced after the sand blasting process can be washed off. Thus adhesive intensity of film is considered to be improved remarkably.

The sand blasting processor as shown in FIG. 11, comprises a nozzle 66 for blasting off grinding sand material, an adjustment valve 68 for properly adjusting volume of grinding material blown off from the nozzle 66, a hopper 70 for storing grinding material, and an air chamber 72 for delivering compressed air therefrom. The nozzle 66 can be moved to adjust blasting angle and blasting distance between the nozzle 66 and the polyimide film 22 in order that sand blasting process can be executed after optimizing conditions related to sand blasting volume, angle, and distance. FIG. 11 shows a device for treating one surface of film, however, both surfaces of the film 26 can also be processed by disposing a pair of nozzles 66 on both surfaces of the film 22. In addition, it is also permissible to forcibly cast grinding material against the film surface by applying an impeller rotating at high velocity in place of blasting grinding material against the film surface by applying compressed air.

Actual conditions for implementing the sand blasting process necessitate that no residue of grinding material and ground object shall remain on the polyimide film surface and own strength of polyimide film shall remain unaffected after completing the sand blasting process. Such practical conditions can optimally be determined based on experiential judgement.

Concretely, silica sand or other grinding material is available for grinding material. In particular, it is desired that such silica sand each having 0.05 mm through 10 mm more specifically 0.1 mm through 1.0 mm of particle size, be introduced. It is desired that blasting distance be in a range from 100 mm to 300 mm and that blasting angle be in a range from 45° to 90°, more particularly in a range from 45° to 60°. It is also desired that blasting volume of grinding material be in a range from 1 kg to 10 kg per minute. This is because residue of grinding material and ground object generated by the sand blasting process will not remain on the surface of the polyimide film, and yet, because of the need to properly control the grinding depth. It is desired that grinding depth be held in a range from 0.01 $\mu\mu$m to a maximum of 0.1 $\mu$m so that own strength of the polyimide film will not be lowered.

It is suggested to use such grinding material comprising fine particles having hardness higher than that of polyimide film. It is also possible to apply either shot-blast, shot-peening, or liquid-honing method as a practical means for projecting grinding material against the film surface at high velocity aside from the above sand blasting process. When executing either the shot-blast method or the short-peening method, spherical shots are used for grinding material instead of using sand. Either of these methods can be effected by optimizing blasting angle, blasting distance, blasting volume, hardness and particle size of shots. The liquid-honing method jets fine particles of grinding material against the film surface at high velocity together with liquid matter. The grinding material of spherical steel shots is used by being mixed with water to which rust-proof agent is added. Even when executing any of the above-cited methods, satisfactory effect similar to the one obtained by the sand blasting process can be obtained.

Thus, a method for improving adhesive property according to the present invention can be performed. Polyimide film on which surface treatment was performed by the present method for improving adhesive property shows very excellent adhesive property, compared with polyimide film on which surface treatment is performed only by flame treatment, alkaline treatment, coupling agent treatment or surface treatment by projecting grinding material of fine particles against the film surface at high velocity. Accordingly, the inventive polyimide film provided with improved adhesive property exhibits incomparable adhesive property by way of realizing solid adhesion between the film and metallic foil such as copper foil by applying adhesive agent. The inventive polyimide film can form an even metallic layer on film surface by applying evaporation method, plating method or sputtering method. Accordingly, the inventive polyimide film having improved adhesive property can ideally be used for a base film of flexible printed circuit boards (FPC).

Concerning method of improving adhesive property of polyimide film according to the present invention, examples by each combination are explained, however, as described in the above, a surface treatment process and a liquid applying process can be performed separately, without continuously executing both processes. The drying furnace 16 (or 28) in FIG. 1 (or FIG. 2) can be exchanged by other drying device, or without providing a drying furnace, film can be naturally dried. It should be understood however that the invention is by no means limited to the above examples, but based on the expertise of those skilled in the art, the invention can be executed by way of adding a variety of improvements, changes, and modifications, within the range that does not depart from the basic concept and scope of the invention.

Referring now to the following examples, the invention is more concretely described below. It should be understood however that the scope of the invention is by no means limited to the following.

EXAMPLE 1

Surface treatment was executed against polyimide film by that after flame treatment was applied against the polyimide film, continuously executing liquid applying in which physical mechanical force was applied to said polyimide film which was wet with liquid, and thereafter said film surface was dried by using almost the same surface treatment device as the one shown in FIG. 1 and polyimide film having 25 μm of thickness produced via known process from aromatic diamine represented by 4,4'-diaminodiphenylether and aromatic tetracarboxylic acid dianhydride represented by pyromellitic acid dianhydride. The surface treatment was executed by that film was set to run at the part corresponding to ⅓ of the flame length from the top of the flame, and by applying 4 m/min. of line speed, flame at 1600° C. for flame treating, temperature of cooling roll at 50° C. In the liquid applying, the surface treatment was executed by applying ethanol for organic solvent and using a rotary brush comprising non-woven cloth of rayon having approx. 15~30 μm of individual filament diameter at 3 kg/m of nipping pressure by rotating the brush at 250 rpm in the direction inverse from the film running direction. Thereafter the film was dried in a drying furnace at 100° C. for 30 seconds.

Concerning the polyimide film treated as the above described, adhesive strength was evaluated in the following method. Concretely, using acrylic adhesive agent "Pyralux" (a product and a trade name of E.I. du Pont de Nemours & Co., Inc.), the processed polyimide film was laminated with a copper foil having 35 μm of thickness "3EC" (an electrolyzed copper foil, a product of Mitui Metal & Mining Co., Ltd.), and then, the above adhesive agent was subject to hardening and reaction at 185° C. for an hour, and finally, FCCL (film/copper-foil laminated board) was produced. Next, a test sample was drawn out of the FCCL so that width of copper pattern of the FCCL could become 3 mm, and then the sample was subject to a tension test via 90° of exfoliation at 50 mm/min. of peeling speed by applying a tension tester "S-100-C", a product of Shimazu Seisakusho, Co., Ltd. Result of measurement based on n=5 of mean value is shown in Table 1. Broken surface witnessed after the peeling test solely occurred along interface between the film and the adhesive agent.

TABLE 1

|  | peeling strength (kg/cm) |
| --- | --- |
| Example 1 | 1.6 |
| Example 2 | 1.6 |
| Example 3 | 1.6 |
| Example 4 | 1.5 |
| Example 5 | 1.5 |
| Example 6 | 1.5 |
| Comparative example 1 | 0.5 |
| Comparative example 2 | 0.9 |

EXAMPLE 2

In the liquid applying, surface treatment of polyimide film was performed in the same procedure as Example 1 except that methanol was used as organic solvent. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

EXAMPLE 3

In the liquid applying, surface treatment of polyimide film was performed in the same procedure as Example 1 except that a nylon brush of 30 μm of individual filament diameter was used as a rotary brush. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

EXAMPLE 4

Using almost the same device shown in FIG. 2, surface treatment was executed against the same polyimide film as Example 1 having 25 μm of thickness by continuously executing the processes of that after applying liquid on film surface, said film was dried and flame treatment was applied. In the above treatment processes, the film was conveyed at 5 m/min. of line speed, and in the liquid applying the surface treatment was executed by applying ethanol for organic solvent, and using a rotary brush comprising nylon non-woven cloth having approx. 5–30 μm of individual filament diameter at 3 kg/m of nipping pressure by rotating the brush at 250 rpm in the direction inverse from the film running direction. The film was dried in a drying furnace at 100° C. for 30 seconds. In addition, in the flame processing this example was performed under the same condition as Example 1. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

EXAMPLE 5

In the liquid applying, surface treatment of polyimide film was performed in the same procedure as Example 4 except that methanol was used as organic solvent. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

EXAMPLE 6

In the liquid applying, surface treatment of polyimide film was performed in the same procedure as Example 4 except that polyester non-woven brush of 5 $\mu$m to 20 $\mu$m of individual filament diameter was used as a rotary brush. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

Comparative Example 1

For comparison, by using polyimide film having 25 $\mu$m of thickness used in Example 1 without performing surface treatment, in the same way as was done for the Example 1, adhesive strength of the polyimide film was evaluated. Result of measurement based on n=5 of mean value is shown in Table 1. Broken surface witnessed after the peeling test solely occurred along interface between the film and adhesive agent.

Comparative Example 2

For comparison, by using polyimide film having 25 $\mu$m of thickness used in Example 1 by performing solely flame treatment, under the same condition as was done for the Example 1, adhesive strength of the polyimide film was evaluated. Result of measurement based on n=5 of mean value is shown in Table 1. Broken surface witnessed after the peeling test solely occurred along interface between the film and adhesive agent.

EXAMPLE 7

Using almost the same device shown in FIG. 1, surface treatment was executed against the same polyimide film as Example 1 having 25 $\mu$m of thickness by continuously executing the processes of that after alkaline treatment was performed on film surface, liquid applying was performed, and thereafter said surface was dried. In the above treatment processes, the film was conveyed at 5 m/min. of line speed, and in the alkaline treating, the surface treatment was executed by applying sodium hydroxide aqueous solution of 5 wt % for 10 seconds, and in the liquid applying, the surface treatment was executed by applying ethanol for organic solvent and by using a rotary brush comprising rayon non-woven cloth having approx. 5~20 $\mu$m of individual filament diameter at 3 kg/m of nipping pressure by rotating the brush at 250 rpm in the direction inverse from the film running direction. The film was dried in a drying furnace at 100° C. for 30 seconds. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

TABLE 2

|  | peeling strength (kg/cm) |
|---|---|
| Example 7 | 1.5 |
| Example 8 | 1.5 |
| Example 9 | 1.5 |
| Example 10 | 1.5 |
| Example 11 | 1.5 |
| Example 12 | 1.5 |
| Comparative example 1 | 0.5 |
| Comparative example 3 | 1.0 |

EXAMPLE 8

In the liquid applying, surface treatment of polyimide film was performed in the same procedure as Example 7 except that methanol was used as organic solvent. In the same way as was done for the Example 7, adhesive strength of the processed polyimide film was evaluated. Result of measurement based on n=5 of mean value is shown in Table 2. Broken surface witnessed after the peeling test solely occurred along interface between the film and adhesive agent.

EXAMPLE 9

In the liquid applying, surface treatment of polyimide film was performed in the same procedure as Example 7 except that polyester non-woven brush of 5 $\mu$m to 20 $\mu$m of individual filament diameter was used as a rotary brush. In the same way as was done for the Example 1, adhesive strength of the processed polyimide film was evaluated. Result of measurement based on n=5 of mean value is shown in Table 2. Broken surface witnessed after the peeling test solely occurred along interface between the film and adhesive agent.

EXAMPLE 10

Using almost the same device shown in FIG. 2, surface treatment was executed against the same polyimide film as Example 1 having 25 $\mu$m of thickness by continuously executing the processes: after liquid applying was performed on film surface, said film surface was dried, thereafter alkaline treatment was performed, further alkaline solution on film surface was washed off, and said film was dried. A drying furnace used after alkaline treatment was omitted in FIG. 2. In the above treatment processes, the film was conveyed at 5 m/min. of line speed, and in the liquid applying the surface treatment was executed by applying ethanol for organic solvent and by using a rotary brush comprising rayon non-woven cloth having approx. 5~30 $\mu$m of individual filament diameter at 3 kg/m of nipping pressure by rotating the brush at 250 rpm in the direction inverse from the film running direction. In the alkaline treating, this example was performed under the same conditions as Example 7, and water was used for washing off alkaline solution. The film was dried in a drying furnace at 100° C. for 30 seconds. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

EXAMPLE 11

In the liquid applying, surface treatment of polyimide film was performed in the same procedure as Example 10 except that methanol was used as organic solvent. In the same way as was done for the Example 1, adhesive strength of the processed polyimide film was evaluated. Result of measurement based on n=5 of mean value is shown in Table 2. Broken surface witnessed after the peeling test solely occurred along interface between the film and adhesive agent.

EXAMPLE 12

In the liquid applying, surface treatment of polyimide film was performed in the same procedure as Example 10 except that a nylon brush of 30 μm of individual filament diameter was used as a rotary brush. In the same way as was done for the Example 1, adhesive strength of the processed polyimide film was evaluated. Result of measurement based on n=5 of mean value is shown in Table 1. Broken surface witnessed after the peeling test solely occurred along interface between the film and adhesive agent.

Comparative Example 3

For comparison, by using polyimide film having 25 μm of thickness used in Example 1 by performing solely alkaline treatment, under the same conditions as were done for the Example 7, adhesive strength of the polyimide film was evaluated. Result of measurement based on n=5 of mean value is shown in Table 2 with the result of Comparative Example 1. Broken surface witnessed after the peeling test solely occurred along interface between the film and adhesive agent.

EXAMPLE 13

Using almost the same device shown in FIG. 2, surface treatment was executed against the same polyimide film as Example 1 having 25 μm of thickness by continuously executing the processes: after liquid applying was performed on film surface, said surface was dried, thereafter coupling agent treatment was performed and further said surface was dried. A drying furnace used after coupling agent treatment was omitted in FIG. 2. In the above treatment processes, the film was conveyed at 5 m/min. of line speed, and in the liquid applying, the surface treatment was executed under the same condition as Example 10, and the film was dried in a drying furnace at 100° C. for 30 seconds after the liquid applying was performed. In addition, in coupling agent treating, solution of coupling agent was formulated by 0.1% by weight of γ-aminopropyltriethoxysilane (concretely, a silane coupling agent KBE903, a product of Shin-etsu Chemical Industries, Co., Ltd.) dissolved in methanol. The coating process was executed by rotating a bar coater at 250 rpm in the direction inverse from the film running direction to coat said film with said solution dissolved in methanol. The solution-coated polyimide film was then dried at 80° C. for a minute. In the same way as was done for the Example 1, adhesive strength of the processed polyimide film was evaluated. Result of measurement based on n=5 of mean value is shown in Table 3. Broken surface witnessed after the peeling test solely occurred along interface between the film and adhesive agent.

TABLE 3

| | peeling strength (kg/cm) |
|---|---|
| Example 13 | 1.5 |
| Example 14 | 1.5 |
| Example 15 | 1.5 |
| Comparative example 1 | 0.5 |
| Comparative example 4 | 1.0 |

EXAMPLE 14

In the liquid applying, surface treatment of polyimide film was performed in the same procedure as Example 13 except that methanol was used as organic solvent. In the same way as was done for the Example 1, adhesive strength of the processed polyimide film was evaluated. Result of measurement based on n=5 of mean value is shown in Table 3. Broken surface witnessed after the peeling test solely occurred along interface between the film and adhesive agent.

EXAMPLE 15

In the liquid applying, surface treatment of polyimide film was performed in the same procedure as Example 13 except that polyester non-woven brush of 5 μm to 20 μm of individual filament diameter was used as a rotary brush. In the same way as was done for the Example 1, adhesive strength of the processed polyimide film was evaluated. Result of measurement based on n=5 of mean value is shown in Table 3. Broken surface witnessed after the peeling test solely occurred along interface between the film and adhesive agent.

Comparative Example 4

For comparison, by using polyimide film having 25 μm of thickness used in Example 1 by performing solely coupling agent treatment, under the same conditions as were done for the Example 13, adhesive strength of the polyimide film was evaluated. Result of measurement based on n=5 of mean value is shown in Table 3 with the result of Comparative Example 1. Broken surface witnessed after the peeling test solely occurred along interface between the film and adhesive agent.

EXAMPLE 16

Using almost the same device shown in FIG. 1, surface treatment was executed against the same polyimide film as Example 1 having 25 μm of thickness by continuously executing the processes: after sand blasting treatment was performed on film surface, liquid applying was performed and further said surface is dried. In the above treatment processes, the film was conveyed at 2 m/min. of line speed, and the sand blasting process was executed by blowing off silica sands having 0.1~1 mm of particle size with one-step pressure by arranging angle and distance between the blowing nozzles and the polyimide film at 45° and 100 mm, where the blowing volume was regulated at 6 kg/min. via adjustment valves. In the liquid applying, the surface treatment was executed under the same conditions as Example 1, and the film was dried in a drying furnace at 100° C. for 30 seconds. In the same way as was done for the Example 1, adhesive strength of the processed polyimide film was evaluated. Result of measurement based on n=5 of mean value is shown in Table 4. Broken surface witnessed after the peeling test solely occurred along interface between the film and adhesive agent.

TABLE 4

|  | peeling strength (kg/cm) |
| --- | --- |
| Example 16 | 1.5 |
| Example 17 | 1.5 |
| Comparative example 1 | 0.5 |
| Comparative example 5 | 0.8 |

EXAMPLE 17

In the liquid applying, surface treatment of polyimide film was performed in the same procedure as Example 16 except that methanol was used as organic solvent and that the rotary brush was rotated at 150 rpm. In the same way as was done for the Example 1, adhesive strength of the processed polyimide film was evaluated. Result of measurement based on n=5 of mean value is shown in Table 4. Broken surface witnessed after the peeling test solely occurred along interface between the film and adhesive agent.

Comparative Example 5

For comparison, by using polyimide film having 25 μm of thickness used in Example 1 by performing solely sand blasting treatment, under the same conditions as were done for the Example 16, adhesive strength of the polyimide film was evaluated. Result of measurement based on n=5 of mean value is shown in Table 4 with the result of Comparative Example 1. Broken surface witnessed after the peeling test solely occurred along interface between the film and adhesive agent.

What is claimed is:

1. A method for treating a polyimide film comprising a combination of:

a process of liquid applying treatment for removing weak boundary layer and stained layer formed on a surface of said film by applying physical mechanical force to said film surface under the condition that said film surface remains wet with liquid;

wherein said liquid is at least one selected from the group consisting of alkane, alkene, alcohol, ketone, ether, halogen, carboxylic acid, aldehyde, and amide; and a surface treatment process for treating polyimide film surface by performing a selected treatment among flame treatment, alkaline treatment, coupling agent treatment or surface treatment by way of projecting grinding material onto the film surface, wherein flame treatment and alkaline treatment are performed in an arbitrary order, coupling agent treatment is performed after liquid applying treatment, and surface treatment by way of projecting grinding material to the film surface is performed before liquid applying treatment.

2. The method for treating a polyimide film specified in claim 1, wherein a drying process for drying said film surface is performed after said liquid applying treatment.

3. The method for treating a polyimide film specified in claim 1 or claim 2, wherein in said process of liquid applying treatment, after treating polyimide film surface by applying physical mechanical force on said film surface under the condition that said film surface remains wet with water or organic solvent, or a solution of organic solvent or aqueous solution, said film surface is treated with another solution.

4. The method for treating a polyimide film specified in claim 1 or claim 2, wherein in said alkaline treatment process, alkaline solution on said film surface is washed off after said alkaline treatment is performed.

5. The method for treating a polyimide film specified in claim 4, wherein in said alkaline treatment process, after said alkaline treatment is performed, alkaline solution on said film surface is washed off, thereafter a drying process for drying said film surface is performed.

6. The method for treating a polyimide film specified in claim 1 or claim 2, wherein after said coupling agent treatment process is performed, a drying process for drying said film surface is performed.

7. The method for treating a polyimide film specified in claim 1 or claim 2 wherein said process for treating said film surface by way of projecting grinding material comprises said blasting treatment.

8. Polyimide film achieved by surface treatment specified in claim 1 or claim 2.

9. The method for treating a polyimide film specified in claim 7, wherein in said sand blasting treatment, particle size of grinding material is 0.05 mm through 10 mm and blasting volume of grinding material is in a range from 1 kg to 10 kg per minute.

10. The method for treating a polyimide film specified in claim 1, wherein said alcohol is at least one selected from the group consisting of ethanol, methanol, or isopropanol.

* * * * *